(12) United States Patent
Konstadinidis (10) Patent No.: US 12,242,906 B1
(45) Date of Patent: Mar. 4, 2025

(54) HARDWARE-IMPLEMENTED HYBRID ANALOG-DIGITAL MIXED-MODE MATRIX MULTIPLY-ADD PROCESSING ELEMENT FOR MACHINE LEARNING APPLICATIONS

(71) Applicant: Georgios Konstadinidis, San Jose, CA (US)

(72) Inventor: Georgios Konstadinidis, San Jose, CA (US)

( * ) Notice: Subject to any disclaimer, the term of this patent is extended or adjusted under 35 U.S.C. 154(b) by 0 days.

(21) Appl. No.: 18/927,565

(22) Filed: Oct. 25, 2024

(51) Int. Cl.
*G06F 1/00* (2006.01)
*G06J 1/00* (2006.01)
*H03M 1/12* (2006.01)

(52) U.S. Cl.
CPC .............. *G06J 1/00* (2013.01); *H03M 1/1245* (2013.01)

(58) Field of Classification Search
CPC ........ G06J 1/02; G06J 1/0056; H03M 1/1245; H03M 1/00; G06F 17/16
USPC .................................. 341/50, 144, 155, 135
See application file for complete search history.

(56) References Cited

U.S. PATENT DOCUMENTS

| 11,610,104 | B1* | 3/2023 | Far | G11C 7/16 |
| 11,775,779 | B2* | 10/2023 | Kenney | G06J 1/02 |
| | | | | 708/2 |
| 2021/0342121 | A1* | 11/2021 | Chakraborty | G11C 11/54 |
| 2023/0177284 | A1* | 6/2023 | Bunandar | G06J 1/005 |
| | | | | 708/7 |

* cited by examiner

*Primary Examiner* — Peguy Jean Pierre
(74) *Attorney, Agent, or Firm* — Plager Schack LLP; Mark H. Plager, Esq.; Stephen Hallberg, Esq.

(57) ABSTRACT

A hardware-implemented hybrid analog-digital mixed-mode matrix multiply-add processing element (PE) for machine learning (ML) applications is disclosed. The hardware-implemented hybrid analog-digital mixed-mode matrix multiply-add PE for ML applications involves using Fin Field-Effect Transistors ("FinFETs"), which provide excellent sub-threshold operation, thereby reducing power requirements, and use variation minimization strategies to improve the overall accuracy. In this way, hybrid analog-digital mixed-mode matrix multiply-add calculations are efficient, low power, and accurate, with the processing element itself in a relatively small surface area.

15 Claims, 13 Drawing Sheets

HARDWARE-IMPLEMENTED HYBRID ANALOG-DIGITAL MIXED-MODE MATRIX MULTIPLY-ADD PROCESSING ELEMENT FOR MACHINE LEARNING APPLICATIONS

BACKGROUND

Embodiments of the invention described in this specification relate generally to hardware implementations intended for machine learning applications, and more particularly, to an analog-digital hybrid hardware implementation of mixed mode matrix multiply-add processing element (PE) for machine learning applications.

Power and area efficient add-multiply implementations for Machine Learning (ML) applications are currently difficult to achieve. For instance, typical analog implementations are rife with accuracy and power issues.

Beyond analog implementations, digital implementations have their own drawbacks. In particular, digital implementations tend to consume a lot of power and are physically spread over a wider silicon area, resulting in a larger spatial footprint, due to a greater need for analog to digital converters (ADC).

Thus, it may be advantageous to reduce the number of required ADCs to reduce the spatial area (footprint) of the implementation and use sub-threshold operation to substantially reduce the overall power. Best suited for this purpose is the use of Fin Field-Effect Transistors ("FinFETs"). A FinFET is an advanced type of transistor used in hardware implementations of semiconductor devices, such as integrated circuits (ICs), microprocessors, graphics processing units (GPUs), system-on-chips (SoCs), etc. The FinFET achieves higher drive current and less parasitics at much smaller area compared to old planar devices, while it allows for low voltage operation with reduced variation and power, due to the excellent subthreshold characteristics. For this reason, using FinFETS in implementations, along with reducing the number of ADCs required, may reduce overall power consumption in a smaller footprint while improving overall accuracy.

Therefore, what is needed is a way to provide an efficient power consuming and small footprint hardware implementation of an analog add-multiply processing element which is highly accurate while consuming less power than conventional digital-based hardware units for mixed mode matrix multiply-add processing operations in machine learning applications.

BRIEF DESCRIPTION

A novel hardware-implemented hybrid analog-digital mixed-mode matrix multiply-add processing element (PE) for machine learning (ML) applications is disclosed. In some embodiments, the hardware-implemented hybrid analog-digital mixed-mode matrix multiply-add PE for ML applications is based on using FinFETs, which provide excellent sub-threshold operation, thereby reducing power requirements, and use variation minimization strategies to improve the overall accuracy. In this way, hybrid analog-digital mixed-mode matrix multiply-add calculations are efficient, low power, and accurate, with the processing element itself in a relatively small surface area. Specifically, the hardware-implemented hybrid analog-digital mixed-mode matrix multiply-add PE of some embodiments provides an analog add-multiply PE. In some embodiments, the analog add-multiply PE is implemented in hardware in a small footprint design that provides very efficient use of power and is operationally highly accurate, achieved via the usage of FinFETs.

The preceding Summary is intended to serve as a brief introduction to some embodiments of the invention. It is not meant to be an introduction or overview of all inventive subject matter disclosed in this specification. The Detailed Description that follows and the Drawings that are referred to in the Detailed Description will further describe the embodiments described in the Summary as well as other embodiments. Accordingly, to understand all the embodiments described by this document, a full review of the Summary, Detailed Description, and Drawings is needed. Moreover, the claimed subject matters are not to be limited by the illustrative details in the Summary, Detailed Description, and Drawings, but rather are to be defined by the appended claims, because the claimed subject matter can be embodied in other specific forms without departing from the spirit of the subject matter.

BRIEF DESCRIPTION OF THE DRAWINGS

Having described the invention in general terms, reference is now made to the accompanying drawings, which are not necessarily drawn to scale, and wherein.

DETAILED DESCRIPTION

In the following detailed description of the invention, numerous details, examples, and embodiments of the invention are described. However, it will be clear and apparent to one skilled in the art that the invention is not limited to the embodiments set forth and that the invention can be adapted for any of several applications.

Embodiments of the invention described in this specification provide a hardware-implemented hybrid analog-digital mixed-mode matrix multiply-add processing element (PE) for machine learning (ML) applications. In some embodiments, the hardware-implemented hybrid analog-digital mixed-mode matrix multiply-add PE for ML applications employs analog add-multiply PEs and FinFETs with sub-threshold operations which reduce overall power consumption while improving overall accuracy through sub-threshold operations and variation minimization strategies.

As stated above, power and area efficient add-multiply implementation for ML applications are currently difficult to achieve due to the power issues and large silicon area of digital implementations, while in the case of analog implementation the issues are related to accuracy and relatively large area and power due to the required ADC. Consequently, existing options have not been able to provide lower power consumption in a smaller spatial footprint with better accuracy of results in the analog or digital implementations. Embodiments of the hardware-implemented hybrid analog-digital mixed-mode matrix multiply-add PE for ML applications described in this specification solve such problems by way of a hybrid analog-digital implementation of multiply add.

Embodiments of the hardware-implemented hybrid analog-digital mixed-mode matrix multiply-add described in this specification differ from and improve upon currently existing implementations of multiply-add processing elements. For instance, existing analog implementations have accuracy issues due to limited dynamic range, variation, and the use of many power hungry ADCs. By contrast, the proposed hardware-implemented hybrid analog-digital mixed-mode matrix multiply-add PE for ML applications solves the accuracy and power issues of typical analog implementations, and is much more efficient that the typical full digital implementations. In particular, the hardware-implemented hybrid analog-digital mixed-mode matrix multiply-add PE for ML applications of some embodiments is a very efficient current mirror based multiplier circuit implementation and utilizes FinFETs with excellent sub-threshold operation, thereby reducing overall power consumption. Furthermore, the FinFETs provide variation minimization strategies which improve the overall accuracy.

The hardware-implemented hybrid analog-digital mixed-mode matrix multiply-add PE for ML applications of the present disclosure may be comprised of the following elements. This list of possible constituent elements is intended to be exemplary only and it is not intended that this list be used to limit the hardware-implemented hybrid analog-digital mixed-mode matrix multiply-add PE for ML applications of the present application to just these elements. Persons having ordinary skill in the art relevant to the present disclosure may understand there to be equivalent elements that may be substituted within the present disclosure without changing the essential function or operation of the hardware-implemented hybrid analog-digital mixed-mode matrix multiply-add PE for ML applications.

1. 4-bit multiply processing element (PE)
2. 4 bit×4 bit multiply-add
3. Sum of partial products
4. Variation analysis
5. Extending to 8-bit PEs
6. Extending to 16-bit PEs
7. 256×256 16-bit multiply-add array The hardware-implemented hybrid analog-digital mixed-mode matrix multiply-add PE for ML applications of the present disclosure generally works by the 4-bit multiply PE is a digitally controlled analog multiplier. Specifically, the 4-bit multiply PE provides cross-coupled, digitally controlled current mirrors to perform the analog multiplication. Simply connecting the outputs of such elements provides the sum for these elements. The 4-bit PE is the base cell used to create the 4×4 bit (or "4 bit×4 bit"), the 16×16 bit (or "16 bit×16 bit"), and the 256 multiply add array.

To make the hardware-implemented hybrid analog-digital mixed-mode matrix multiply-add PE for ML applications of the present disclosure, a person may start with designing the 4-bit element. This would involve adherence to standard layout practices to minimize variation and allow for abutments to minimize area overhead. The DAC at the input is formed by the input transistors in the PE stack. The data can come from nearby memory elements, such as SRAM bits, or RRAM, or other types of memory. These memory bits should be combined with the analog PE to provide an in-memory machine learning PE. These elements will be combined to form an in-memory full multiply-add hybrid ML PE array. Notably, the 4-bit element is the basic cell and, consequently, can be used to form different array combinations. Also, the ADC could be substituted with direct computation in the analog domain.

Machine learning applications typically require massive quantities of sum of product calculations for each successive node of the neural network. This is demonstrated in FIG. 1, which is described below. Despite the many sum of product calculations needed, it is possible to use the hardware-implemented hybrid analog-digital mixed-mode matrix multiply-add PE of the present disclosure as a substitute for the typical power-hungry multiply-add array in conventional processing units, such as in graphics processing units (GPUs) and Tensor processing units (TPUs). Specifically, by utilizing the hardware-implemented hybrid analog-digital mixed-mode matrix multiply-add PE reduces the overall power consumed. Thus, the hardware-implemented hybrid analog-digital mixed-mode matrix multiply-add PE is highly advantageous in inference and ML training applications that typically consume very high power and require large silicon area at high cost.

Figure 1:
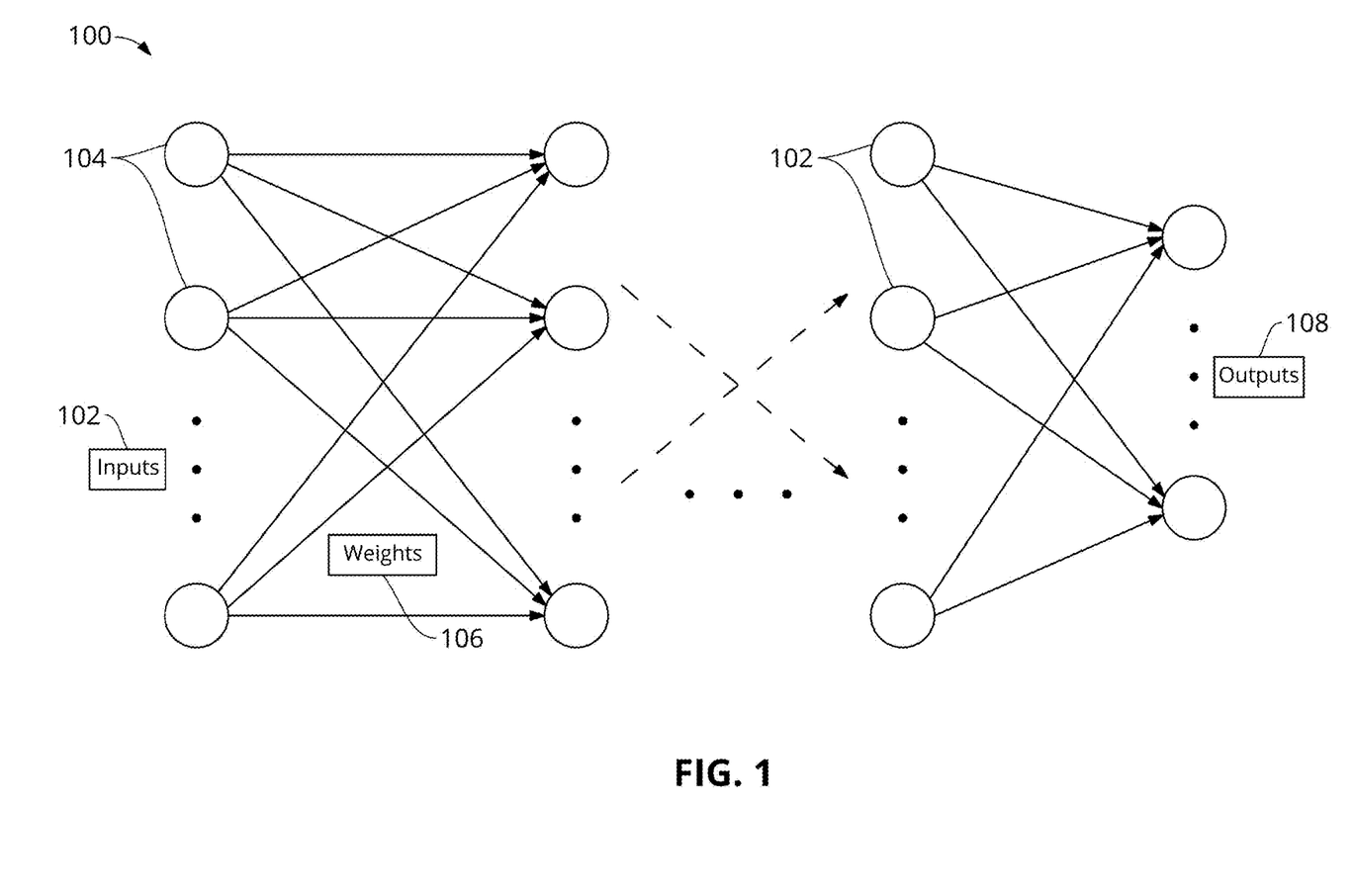
FIG. 1 conceptually illustrates an exemplary deep neural network.

By way of example, FIG. 1 conceptually illustrates an exemplary deep neural network 100. Shown in this figure are inputs 102, nodes 104, weights 106, and outputs 108 for the deep neural network 100. Typically, a hardware neural network is a hardware implementation of a matrix-vector multiplication procedure based on a weight matrix and a data vector multiplication in the form of a systolic array. The matrix-vector multiplication procedure is repeated for millions or billions of data vectors and different weight matrices per Machine Learning model. The sum of the multiplications is taken and the multiplication+addition is performed by a combination of smaller PEs, from 4-bit to 64 bit. In aggregate, the multitude of smaller PEs end up occupying a lot of chip area and consuming a lot of power. In fact, existing Machine Learning chips typically consume 500-1000 W.

Consequently, when these chips are combined in larger system clusters, the system clusters end up consuming quite a lot of power. In particular, the amount of power consumed is typically on the scale KWatts to MWatts. Therefore, with respect to AI and ML applications, it is imperative to implement the hardware PEs for these matrix-vector multiplication procedures in a very efficient way in terms of speed, area (footprint needed on-chip), and power in order to provide improved performance and cost savings.

Figure 2:
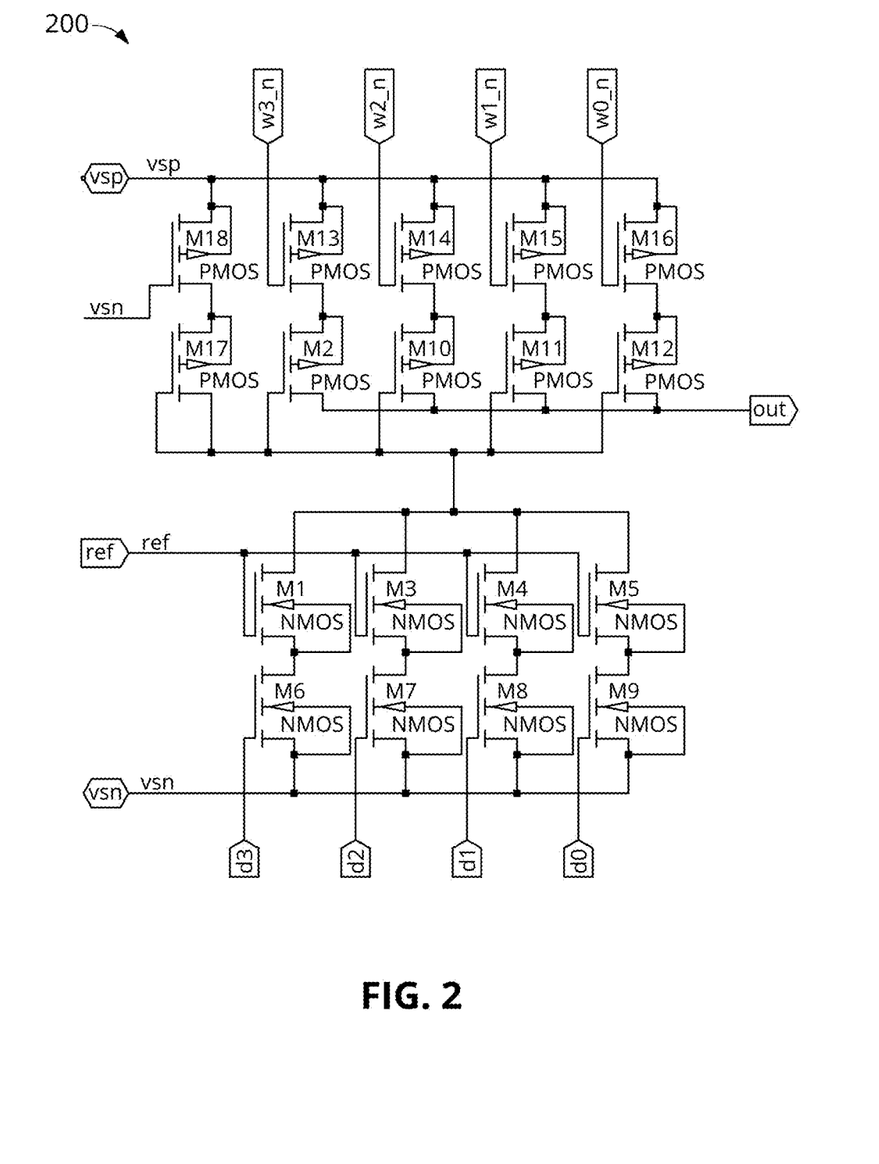
FIG. 2 conceptually illustrates a schematic view of a 4-bit×4-bit processing element (PE) multiplication function in some embodiments.

By way of example, FIG. 2 conceptually illustrates a schematic view of a circuit for an analog implementation of a 4-bit×4-bit processing element (PE) multiplication function 200 (hereinafter referred to as the "analog-implemented 4-bit×4-bit multiplication PE 200" or the "circuit 200"). The analog-implemented 4-bit×4-bit multiplication PE 200 shown in this figure provides a solution to the problems noted above, by reference to FIG. 1. Specifically, the analog-implemented 4-bit×4-bit multiplication PE 200 requires 50-100 times less power than conventional implementations. Furthermore, the analog-implemented 4-bit×4-bit multiplication PE 200 satisfies the speed requirements—fast or faster performance—and the spatial area needs—smaller footprint on-chip.

Notably, the analog-implemented 4-bit×4-bit multiplication PE 200 works by using cross-coupled current mirrors to perform the multiplication function. The bottom stack of the circuit 200 (i.e., NMOS transistors M6, M7, M8, and M9), serves as a 4 bit digital-to-analog converter (DAC) for the data <d3:d0>. The transistor M6 is eight times the size of the transistor M9. The transistor M7 is four times the size of the transistor M9. The transistor M8 is twice the size of the transistor M9. In the corresponding stack of transistors, each transistor—M1, M3, M4, and M5—have the same size as the corresponding transistor—M6, M7, M8, and M9, respectively. These transistors are connected to a current mirror configuration controlled by the voltage on node "ref". The current in the branch M9, M5 will be equal to the reference current, while the current in the stack M1, M6 will be eight times the reference current. The connection of the drains of the transistors M1, M3, M4, and M5 provides the summation of the currents of the four branches and a binary representation of the data input <d3:d0> in terms of current.

This current now serves as a reference current for the current mirror formed by M17 and transistors M2, M10 M11, M12. The PMOS transistors M13, M14, M15, and M16 serve as the DAC unit for the weights vector <w3_n: w0_n> (where the notation 'w_n' means inverse of 'w'). In a similar fashion as in the bottom stack, the transistors M13, M2 are eight times the transistors in transistor branch M12, M16. Likewise, the transistors in branch M10, M14 are four times the M12, M16 size, while transistors in the M15, M11 branch are two times the size of the M12, M16 transistors. Notably, the transistors M17, M18 are the same size as M12, M16. The ratio of sizing of the PMOS vs NMOS transistors follows the beta ratio of the process.

The current in the M17, M18 branch will be the total current from the bottom NMOS stack while the current in the M2, M13 branch will be eight times the current in the M17, M18 branch, based on the current mirror function. Similarly, the current in the M10, M14 branch is four times the current in the M17, M18 branch. Finally, the current in the M11, M15 branch is two times the current in the M17, M18 branch. Finally, the current in the M12, M16 branch is one times the current (or, rather, the same as) the reference current. The end result is that the current at the node "out" will be equal to the product of the total current of the bottom stack times the current of the top stack, corresponding to a 4 bit data×4 bit weight multiplication operation. The role of M18 is to provide the same stack content as the rest of the top stack, offering the same virtual ground for all nodes in the middle of the top stack and to help M17 provide an accurate reference current.

Power consumption is very limited because the whole operation is in the sub-threshold regime of the transistor operation. Furthermore there is no power consumption when the data or the weights are zero, as in the case of sparse matrices, thereby automatically reducing the overall power without requiring special clock gating techniques.

The larger transistors are implemented as copies of the identical small transistors to minimize the same diffusion layout dependent effects (LOD), and offer the same layout context for all transistors. This reduces the overall variability as this now becomes a root mean square function of the same layout transistor variation. It is strongly recommended to use a FinFet process that has a much better sub-threshold slope than old planar devices to further reduce variation and improve accuracy. This is especially important since operation is at the sub-threshold regime of the transistor operation.

Figure 3:
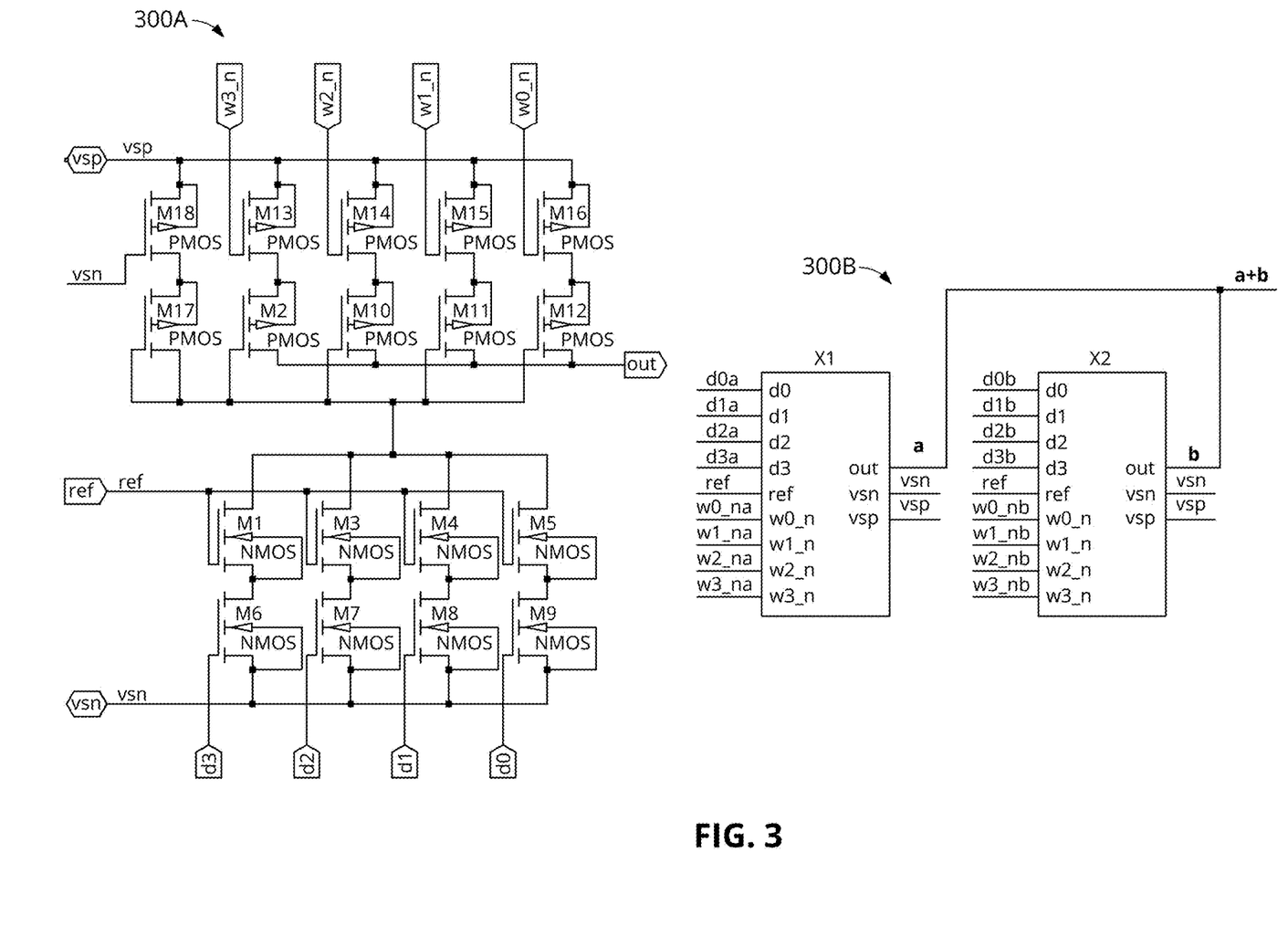
FIG. 3 conceptually illustrates a schematic view of 4-bit×4-bit multiplication-addition in which the sum of two partial products is calculated by connecting the outputs of two 4-bit multiply PEs in some embodiments.

By way of another example, FIG. 3 conceptually illustrates a schematic view of 4-bit×4-bit multiplication-addition in which the sum of two partial products is calculated by connecting the outputs of two 4-bit multiply PEs 300B. The two 4-bit multiply PEs 300B are labeled as 'X1' (referred to as "PE X1") and 'X2' (referred to as "PE X2") in this figure and are based on the circuit configuration 300A. Specifically, the "addition" portion of the multiplication-addition functionality is achieved by simply connecting together the output 'a' of PE X1 and the output 'b' of PE X2. In this configuration, the current through the "a+b" node will be the sum of the current of PE X1 and the current of PE X2. This is an extremely efficient implementation in contrast to a digital implementation using complicated adder structures that take a lot of area and burn a lot of power.

Figure 4A:
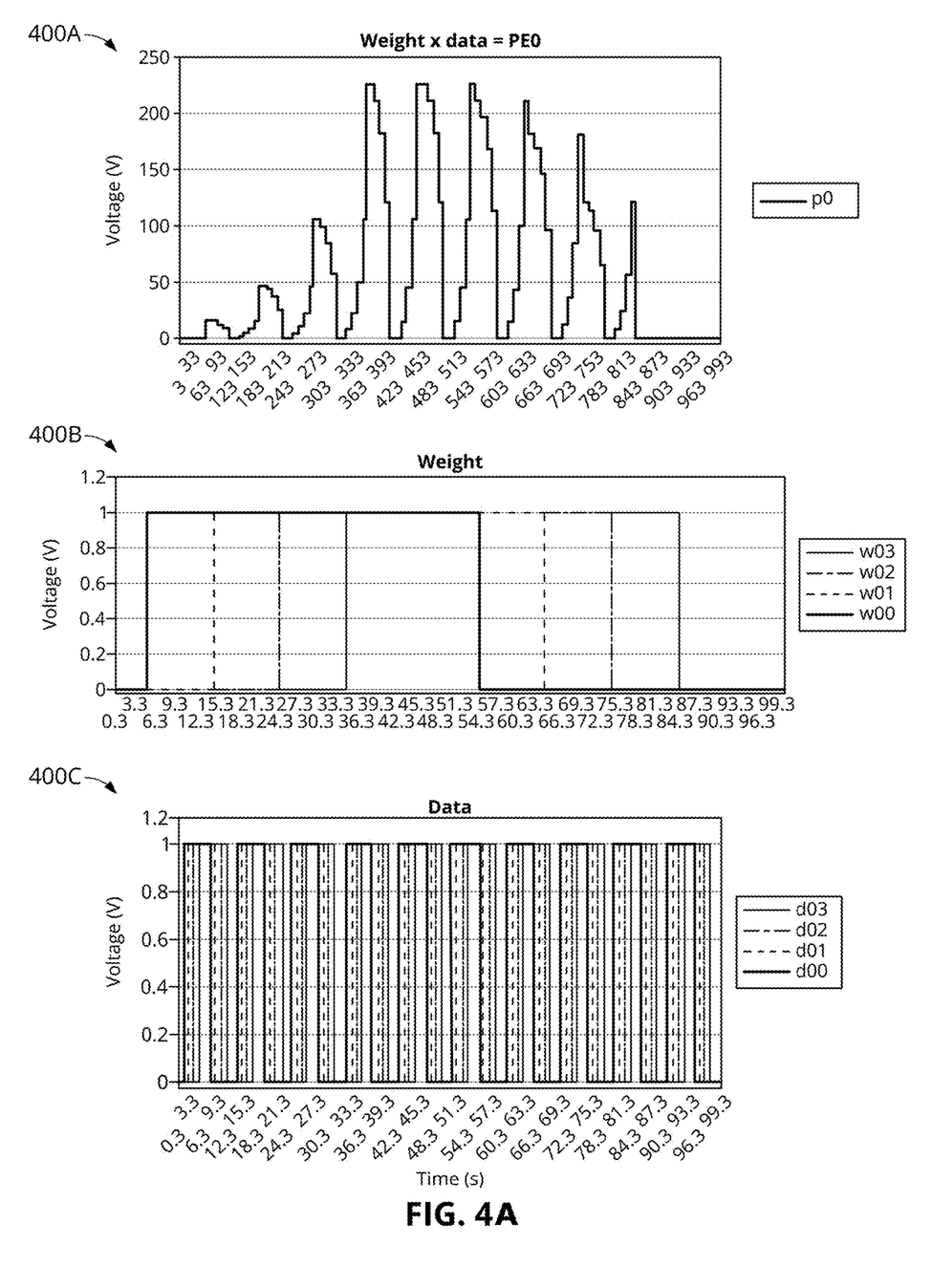
FIGS. 4A and 4B conceptually illustrate schematic views of the results from hand calculation of the sum of two partial products as provided as the outputs of two processing elements, $PE_0$ and $PE_1$ versus simulation results.
Figure 4B:
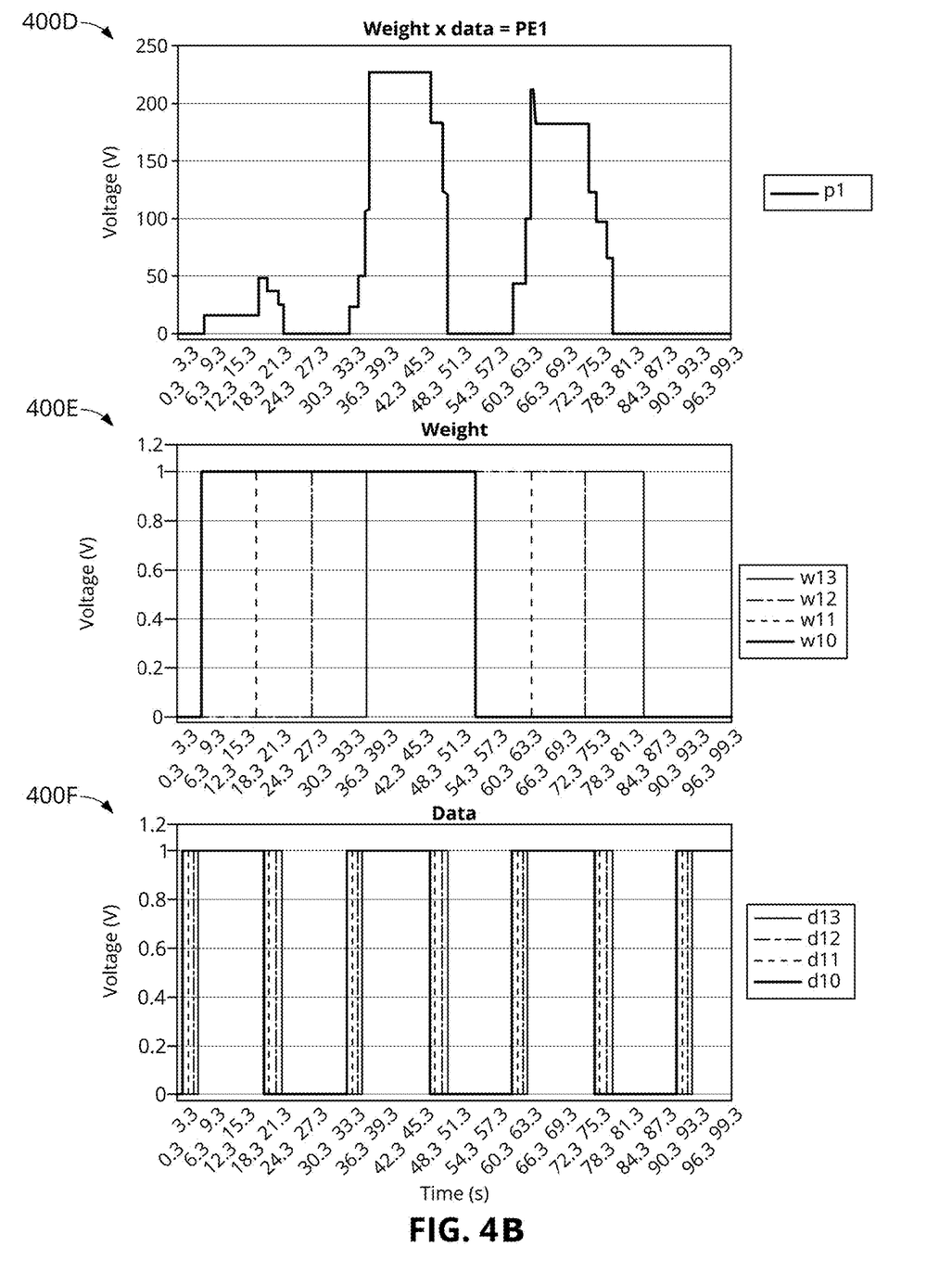

Now referring to some exemplary diagrams, FIGS. 4A and 4B conceptually illustrate schematic views of the results from hand calculation of the sum of two partial products as provided as the outputs of two processing elements, $PE_0$ and $PE_1$ versus simulation results. Specifically, FIG. 4A demonstrates a weight×data=$PE_0$ diagram 400A, a weight diagram 400B, and a data diagram 400C. The data diagram 400C provides the data waveforms (voltage of time), while the weight diagram 400B demonstrates the weight waveforms. The weight×data=$PE_0$ diagram 400A shows the resulting 4 bit×4 bit multiplication waveform using the processing element $PE_0$. Turning to FIG. 4B, a weight×data=$PE_1$ diagram 400D is shown along with another weight diagram 400E, which provides the weight waveforms, and another data diagram 400F, which provides the data waveforms. As above, the weight×data=$PE_1$ diagram 400D demonstrates the resulting 4 bit×4 bit multiplication waveform using the other processing element, $PE_1$.

Figure 5:
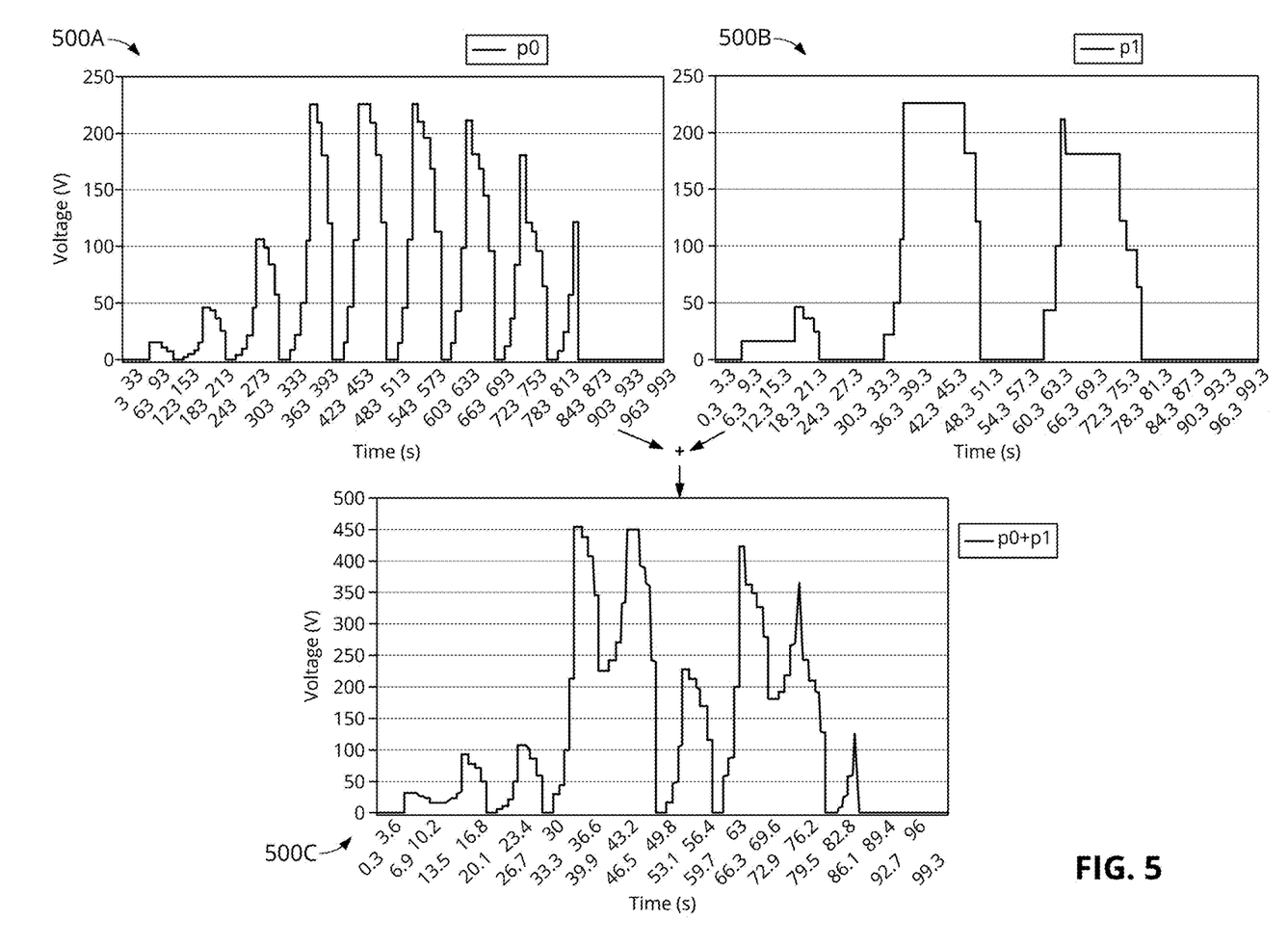
FIG. 5 conceptually illustrates a schematic view of the results of the hand calculation for the sum of two partial products, namely, the partial product from $PE_0$ and the partial product from $PE_1$.

By way of example, FIG. 5 conceptually illustrates a schematic view of the results of the hand calculation for the sum of two partial products, namely, the partial product from $PE_0$ and the partial product from $PE_1$. Specifically, the partial product output from $PE_0$ is shown in diagram 500A while the partial product from $PE_1$ is shown in diagram 500B. When the partial product waveform output from $PE_0$, as shown in diagram 500A, is added to the partial product waveform from $PE_1$, as shown in diagram 500B, the results represent the sum of the 4 bit×4 bit products waveforms, as shown in diagram 500C.

Figure 6:
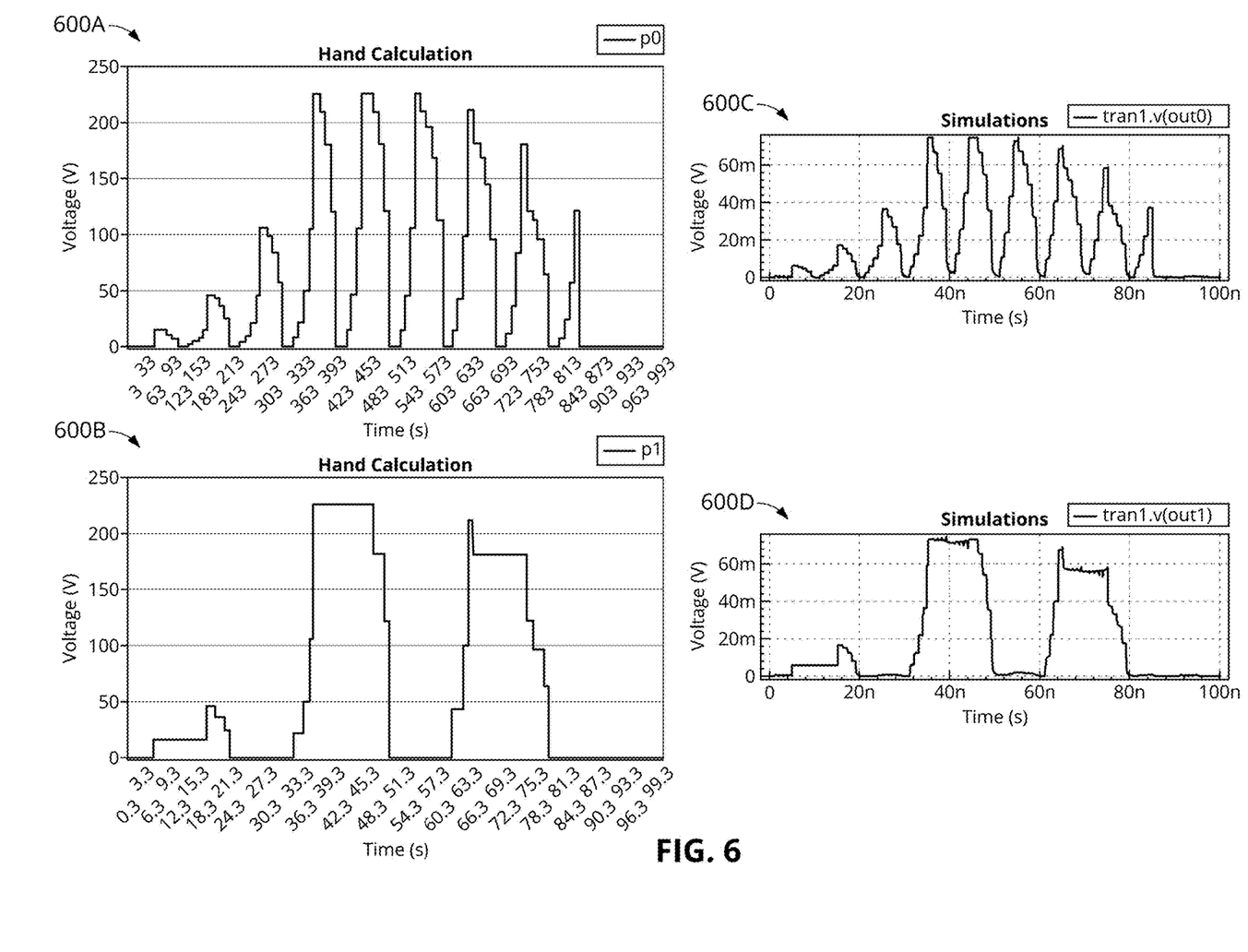
FIG. 6 conceptually illustrates a schematic view of hand calculated expected results vs. simulation results for each processing element, $PE_0$ and $PE_1$.

A visual comparison of the hand calculations to the simulation results is demonstrated in FIG. 6, which is described next. Specifically, FIG. 6 conceptually illustrates a schematic views of the hand calculated expected results vs. simulation results for each processing element, $PE_0$ and $PE_1$. In particular, a hand calculation diagram 600A is shown for the waveform in connection with processing element $PE_0$ while a separate hand calculation diagram 600B is shown for the waveform of the other processing element, $PE_1$. These are compared to simulation results. That is, the simulation charts 600C and 600D are compared to the hand calculation diagram 600A for $PE_0$ and the other hand calculation diagram 600B for $PE_1$, respectively. The comparisons in this case show high levels of agreement between the hand calculated results (as one would expect) and simulated results (as would seem to be the case as applied).

Figure 7:
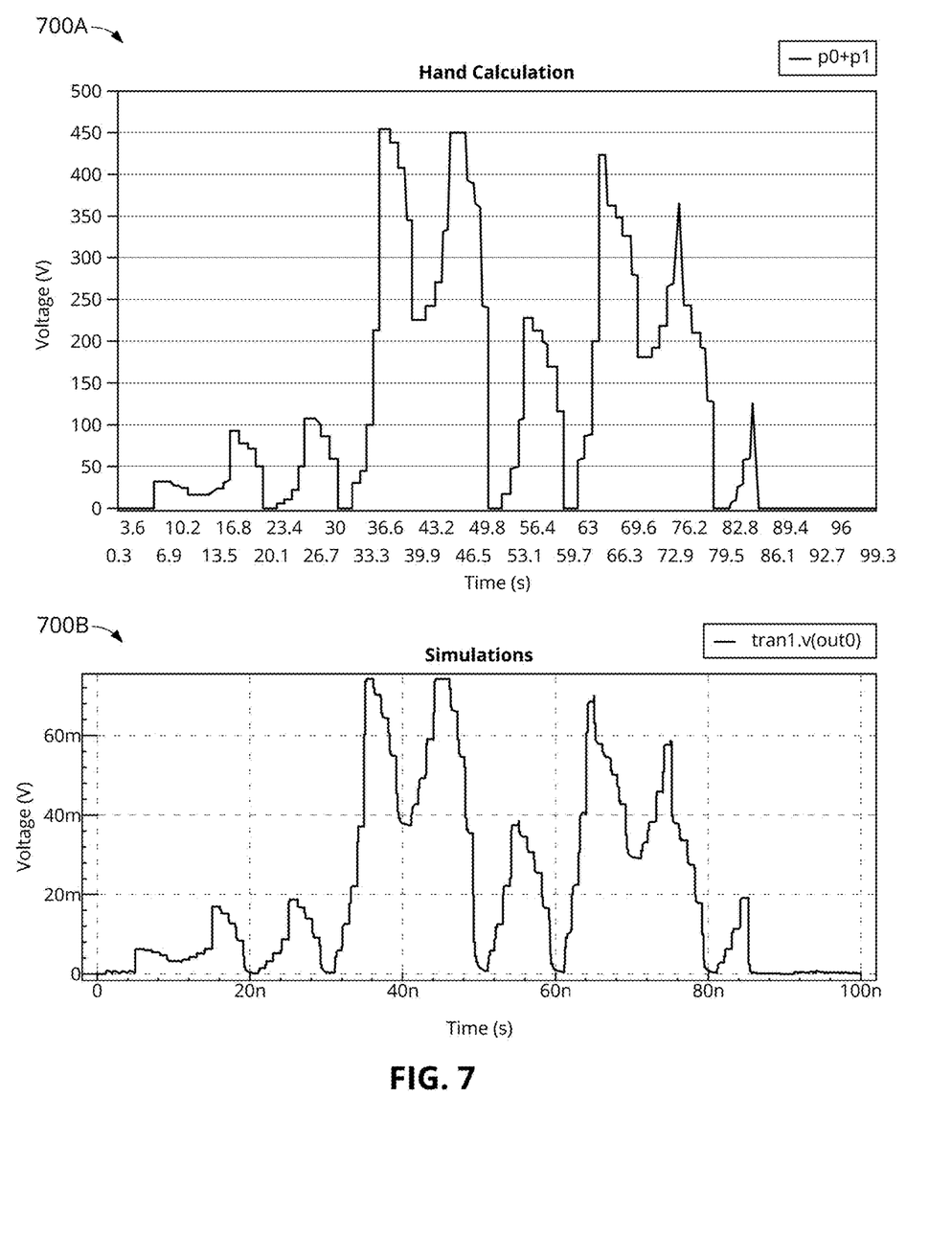
FIG. 7 conceptually illustrates a schematic view of hand calculated expected results vs. simulation results for the sum or partial products by connecting outputs of the two 4-bit multiply PEs (out0 of $PE_0$+out1 of $PE_1$).

By way of example, FIG. 7 conceptually illustrates a schematic view of hand calculated expected results 700A in comparison to simulation results 700B for the sum of partial products, as occurs by connecting the outputs of the two 4-bit multiply PEs. Specifically, the hand calculated results 700A demonstrate the sum of partial products arising when the outputs of the processing elements are connected together, that is, 'out0' of $PE_0$+'out1' of $PE_1$). This, of course, is similar to the situation described above, by reference to FIG. 3, in which the 'a' output of 'PE X1' is added to the 'b' output of 'PE X2'. Again, there is excellent agreement between the expectation from hand calculated results 700A and the results from corresponding simulations 700B.

Figure 8:
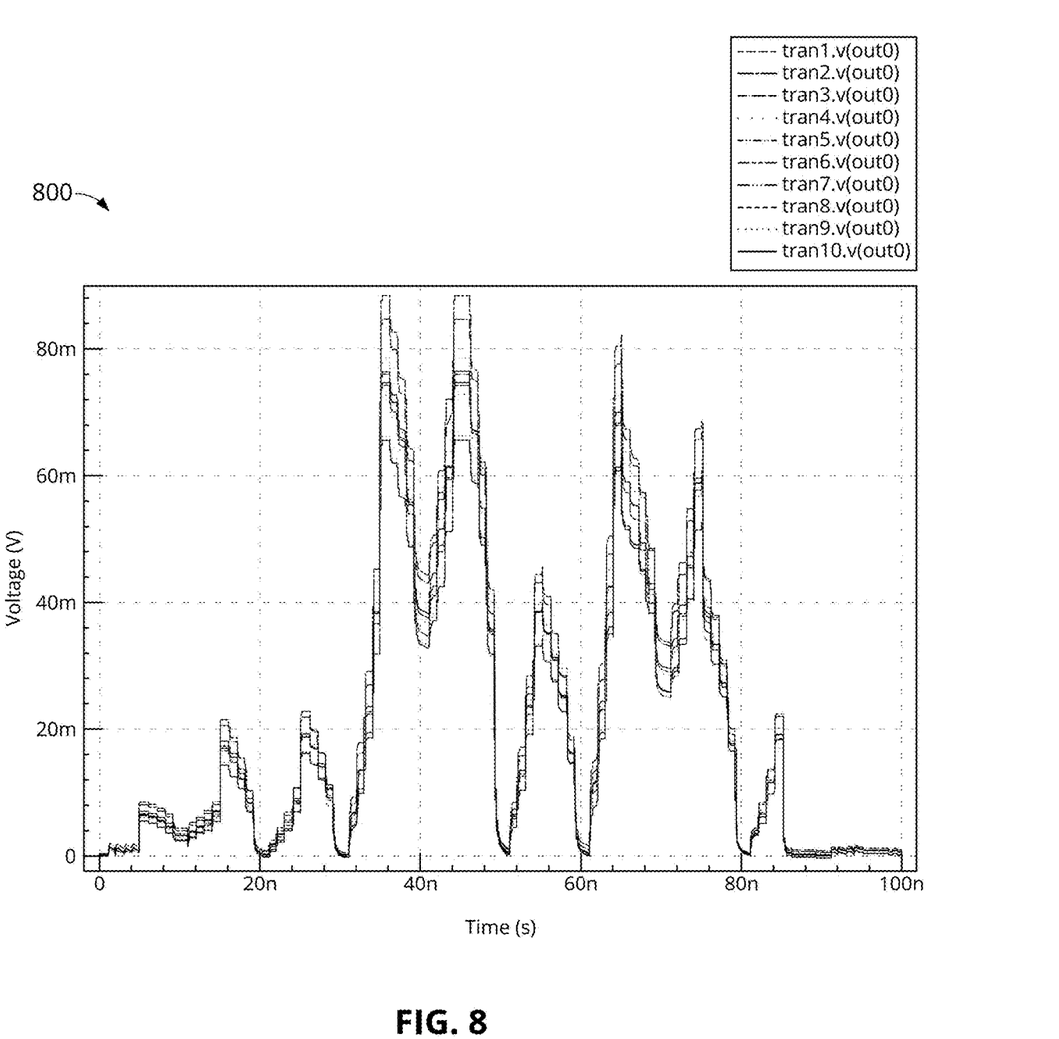
FIG. 8 conceptually illustrates a graph across process corners and temperature, without time zero calibration.

By way of example, FIG. 8 conceptually illustrates a graph 800 across process corners and temperature, without time zero calibration, for ten process corners. This graph 800 shows the circuit response (sum of products of the processing elements) in comparison with various process corners (typical, fast, slow transistors and their skew, as well as voltage and temperature conditions). As expected there is some variation since the drive current per transistor will depend on the process corner, temperature, and voltage conditions.

Figure 9:
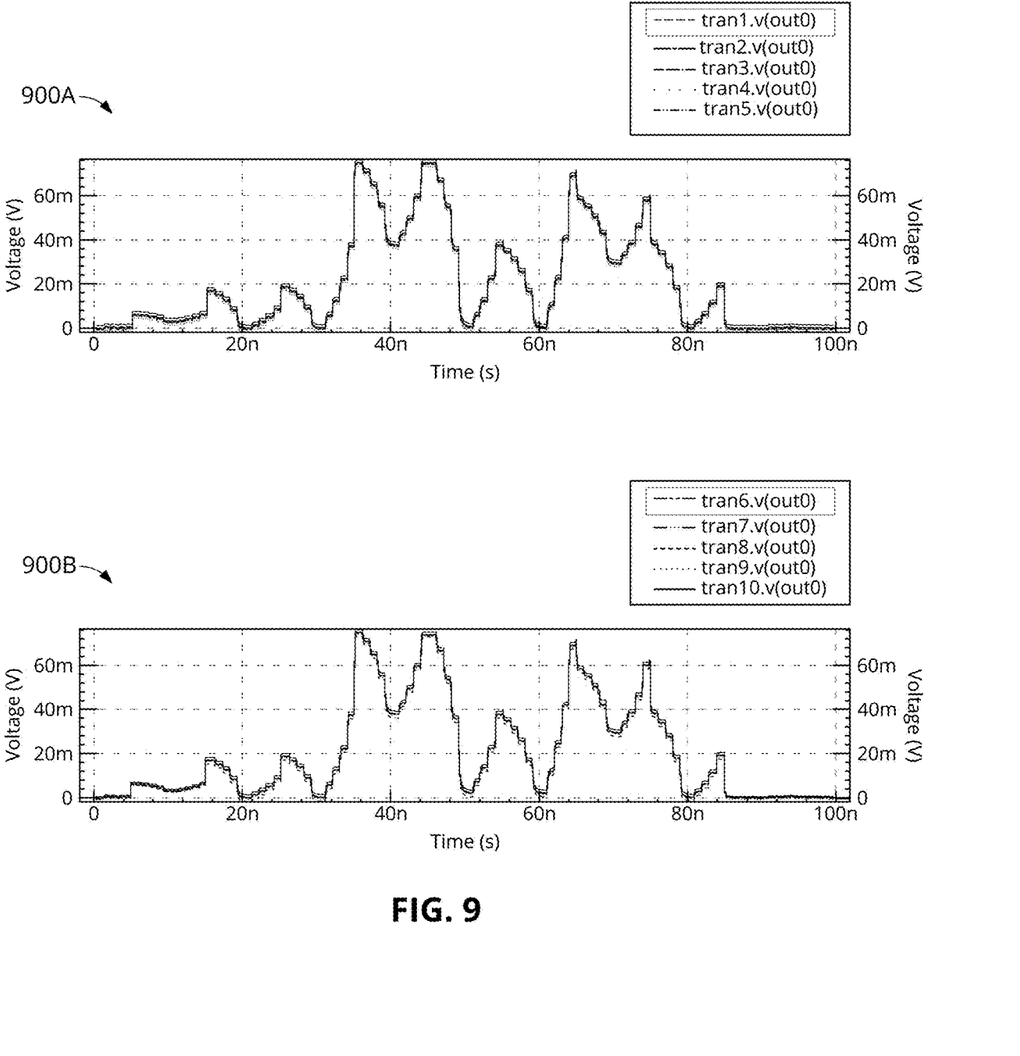
FIG. 9 conceptually illustrates other graphs across process corners and temperature after a single calibration per chip at time zero.

Now, turning to FIG. 9, some other graphs 900A and 900B are shown across process corners and temperature after a single calibration per chip at time zero. Specifically, the graphs 900A and 900B provide clarity with respect to the expected variation, as shown in the graph 800 described above by reference to FIG. 8, by splitting the graph across two groups. One group involves transistors 1-5 with results charted out in graph 900A and the other group involves transistors 6-10, with results charted out in graph 900B.

Figure 10:
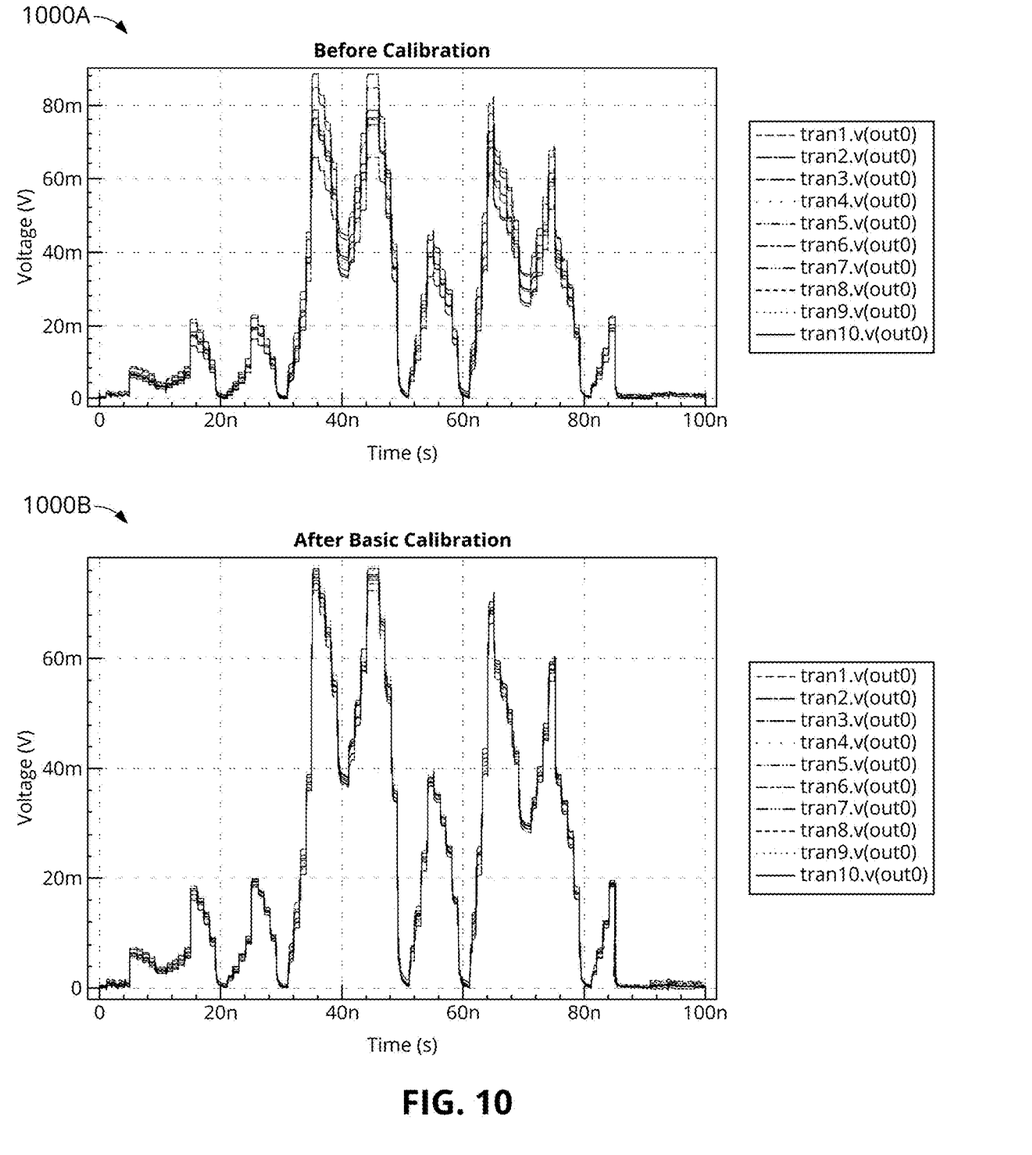
FIG. 10 conceptually illustrates a comparison of a before calibration graph across process corners and temperature and an after calibration graph across process corners and temperature.

A key advantage of the proposed approach is that it requires only a single calibration point to remove the variation across Process, Voltage, Temperature variation (PVT). Since the processing elements use the same reference current, and the top PE uses as reference the bottom PE, a single calibration of the main reference current will compensate for the voltage and temperature variation and part of the process variation. This is demonstrated next, by reference to FIG. 10. Specifically, FIG. 10 conceptually illustrates graph 1000A before calibration across process corners and temperature and a calibration graph 1000B after a single calibration across process corners and temperature. Notably, the calibration for temperature and voltage is performed automatically and continuously. Specifically, the calibration may be performed automatically by using standard configurations, like Band-Gap reference-based current sources.

As noted, the process calibration occurs once. In particular, this single calibration occurs at the wafer probe stage and accounts for both the reference source trimming and the process specific transistor beta ratio compensation. A single voltage measurement at the output to obtain a specific output value is being used to calibrate the reference current through a comparator and digital reference current search using a simple digital control loop.

Furthermore, the beta ratio adjustment is performed based on the wafer probe basic process monitor data and is adjusted by controlling—in a binary digital fashion—the strength of the PMOS reference current, per row, by connecting or disconnecting parallel transistors appropriately to achieve the required strength and beta ratio through, again, a simple control loop.

The proposed multiply-add implementation can be easily expanded by connecting several 4 bit×4 bit PE cells together in a row covering sizes of 128 cells to 256 cells, as is typically used in NN applications. The limitation on how many cells to connect comes from the fact that each node needs to be able to drive the full capacitive load of all nodes connected to this summation node, and this affects speed. Buffer stages may be introduced to allow for larger and faster circuit implementations. Another limiting factor may be the max error allowed, as adding too many elements with a limited dynamic range will increase the quantization error of the analog-to-digital converter (ADC) needed to translate the results of the multiplication-addition to the digital domain for further calculations in that domain. An 8 bit accuracy can be achieved relatively easily and this is adequate for most applications. This is shown in detail in FIG. 11, which is described next.

Figure 11:
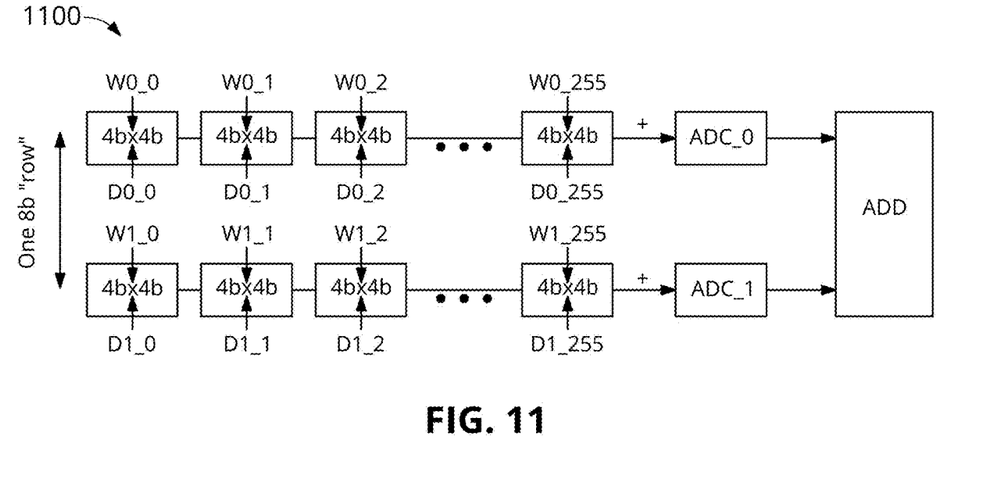
FIG. 11 conceptually illustrates a schematic view of extending to 8 bit PEs in some embodiments with one 8 bit row×256 columns.

Specifically, FIG. 11 conceptually illustrates a schematic view of an extension 1100 to 8 bit PEs with one 8 bit row×256 columns. As shown in this figure, the multiply-add is extended to 8 bit×8 bit multiply-add over several cells by adding an additional row of elements, which are demonstrated in the bottom row of 4 bit×4 bit PE cells. The results of the ADCs at the ends of these rows (specifically, ADC_0 and ADC_1) are added together, after a shift of 4 bits towards the most significant bit (MSB) location to form the 256 element 8 bit×8 bit multiply-add function. Apart from the improvement in speed this offers, the effect of splitting into separate rows results in a smaller dynamic range per row, thereby reducing the quantization error of the ADCs. Another big advantage of the proposed implementation is the use of a combination of 4-bit ADCs and appropriate shift logic instead of using a single compact 8-bit ADC, leading to a substantial overall area and power reduction with minimal loss of accuracy.

Figure 12:
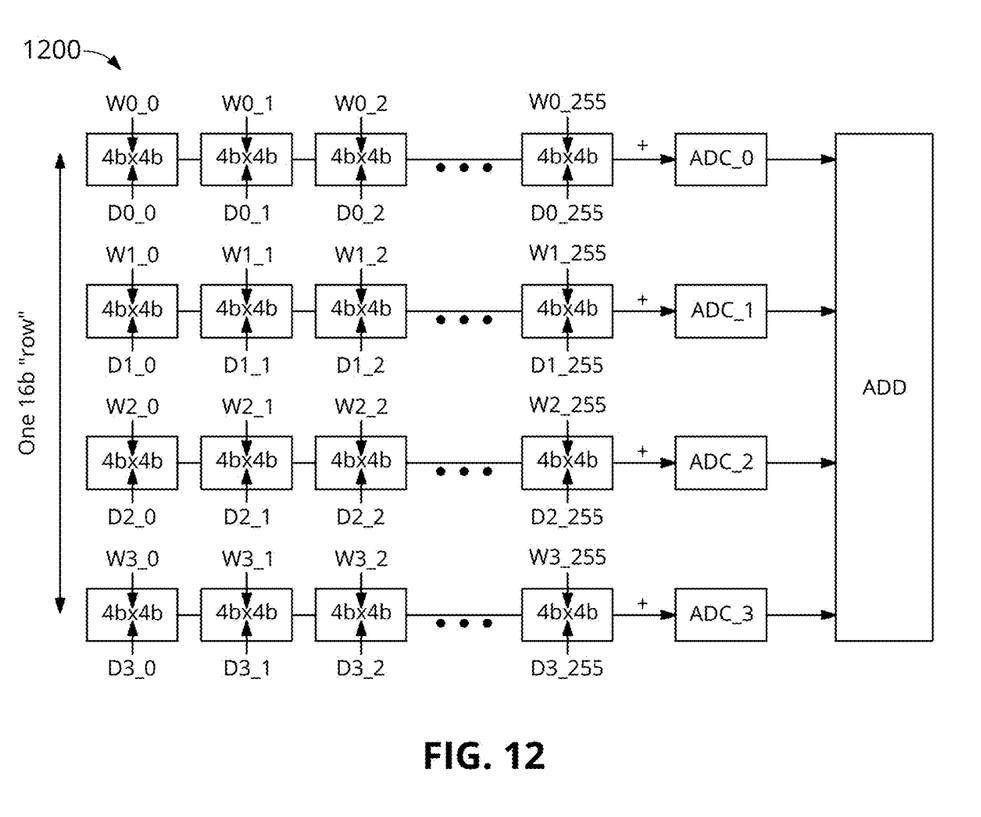
FIG. 12 conceptually illustrates a schematic view of extending to 16 bit PEs in some embodiments with one 16 bit row×256 columns.

This modular approach can also be easily expanded to 16 bit×16 bit multiply-add configurations, such as that shown in FIG. 12, described next. Specifically, and by way of example, FIG. 12 conceptually illustrates a schematic view of extending to 16 bit PEs 1200 with one 16 bit row×256 columns. As shown in this figure, the number of rows of 4 bit×4 bit PE cells is greater and each row has an ADC at the end (i.e., ADC_0, ADC_1, ADC_2, and ADC_3). As described above, by reference to FIG. 11, the results of each ADC will need to be shifted by 4 bits towards the MSB, moving from ADC_0 to ADC_3, prior to the addition in the digital domain.

Figure 13:
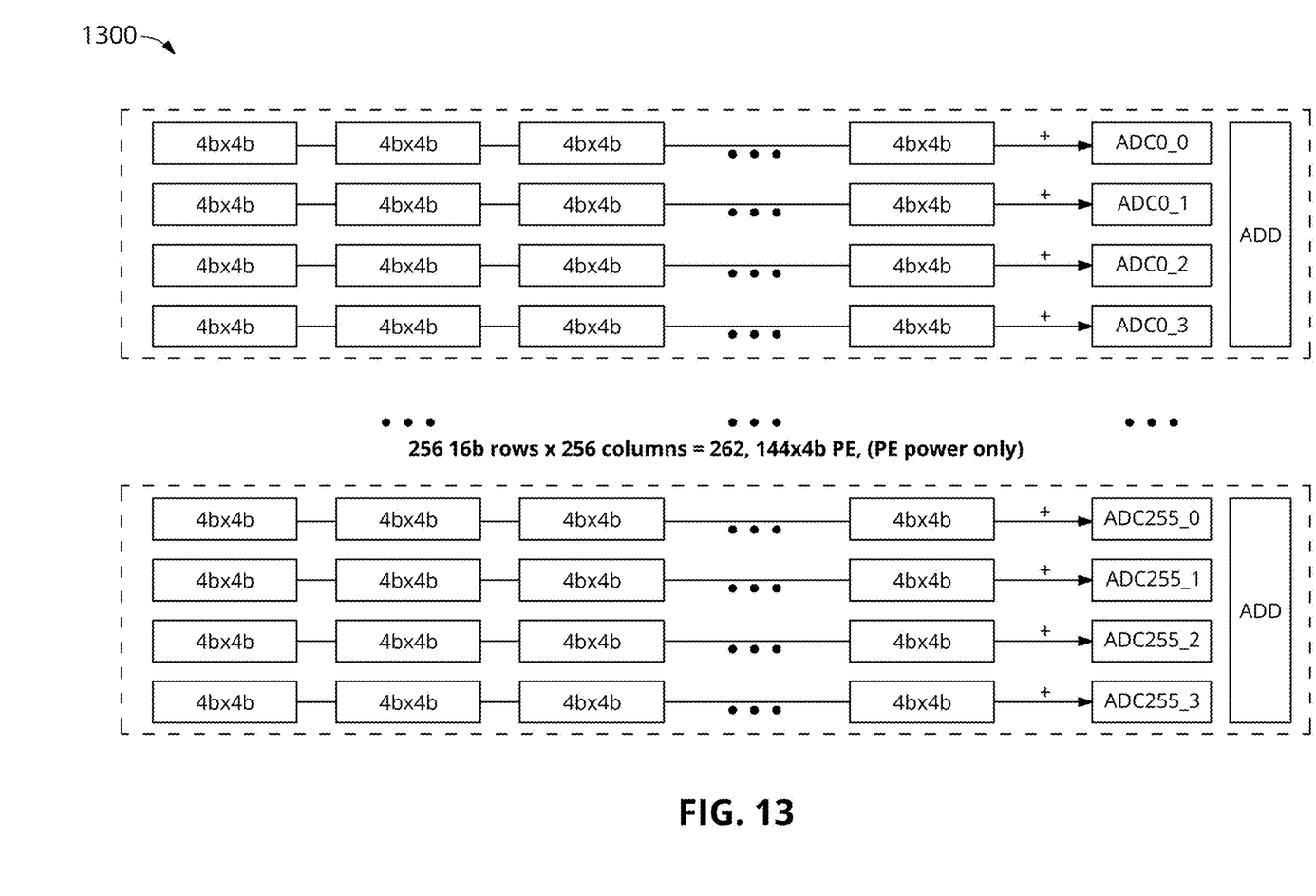
FIG. 13 conceptually illustrates a schematic view of 256×256 16 bit array multiply-add in some embodiments.

The scale of expansion possible is quite great. By way of example, FIG. 13 conceptually illustrates a schematic view of 256×256 16 bit array multiply-add 1300. Specifically, this figure shows how the modular approach described above allows for expansion to 256 rows of 16 bit×16 bit and 256 columns representing the 256×256 16 bit multiply-add function.

Additionally, the hardware-implemented hybrid analog-digital mixed-mode matrix multiply-add PE for ML applications is adaptable for different designs. For instance, the hardware-implemented hybrid analog-digital mixed-mode matrix multiply-add PE for ML applications can be used to produce low power, area efficient GPUs, TPUs, edge computing applications, mobile devices image processing, tensor unit accelerators, etc.

The above-described embodiments of the invention are presented for purposes of illustration and not of limitation. While these embodiments of the invention have been described with reference to numerous specific details, one of ordinary skill in the art will recognize that the invention can be embodied in other specific forms without departing from the spirit of the invention. Thus, one of ordinary skill in the art would understand that the invention is not to be limited by the foregoing illustrative details, but rather is to be defined by the appended claims.

I claim:

1. A hardware-implemented hybrid analog-digital mixed-mode matrix multiply-add processing element (PE) for machine learning (ML) applications comprising:
   a 4 bit multiply processing element (PE) that performs a multiplication function;
   a first circuit that implements the 4 bit multiply PE to calculate a first current result based on a first reference current;
   a second circuit that implements the 4 bit multiply PE to calculate a second current result based on a second reference current; and
   a connection between a first output of the first circuit and a second output of the second circuit to produce a combined current resulting from implementation of a multiply-add function that calculates a sum of the first current result and the second current result.

2. The hardware-implemented hybrid analog-digital mixed-mode matrix multiply-add PE for ML applications of claim 1 further comprising an analog-to-digital converter (ADC) that is configured to convert the combined current to a digital value based on the sum of the first current result and the second current result.

3. The hardware-implemented hybrid analog-digital mixed-mode matrix multiply-add PE for ML applications of claim 1, wherein the first circuit comprises a plurality of first circuit transistors, wherein the second circuit comprises a plurality of second circuit transistors.

4. The hardware-implemented hybrid analog-digital mixed-mode matrix multiply-add PE for ML applications of claim 3, wherein the plurality of first circuit transistors comprise a bottom stack of four first circuit transistors and a top stack of four first circuit transistors.

5. The hardware-implemented hybrid analog-digital mixed-mode matrix multiply-add PE for ML applications of claim 4, wherein the bottom stack of four first circuit transistors serves as a 4 bit digital-to-analog converter (DAC) for incoming data.

6. The hardware-implemented hybrid analog-digital mixed-mode matrix multiply-add PE for ML applications of claim 4, wherein the bottom stack of four first circuit transistors are connected to a current mirror configuration controlled by a voltage of a reference current.

7. The hardware-implemented hybrid analog-digital mixed-mode matrix multiply-add PE for ML applications of claim 6, wherein the bottom stack of four first circuit transistors comprises a first bottom transistor, a second bottom transistor, a third bottom transistor, and a fourth bottom transistor, wherein the top stack of four transistors comprises a first top transistor, a second top transistor, a third top transistor, and a fourth top transistor.

8. The hardware-implemented hybrid analog-digital mixed-mode matrix multiply-add PE for ML applications of claim 7, wherein a first size of the first bottom transistor is eight times a fourth size of the fourth bottom transistor, wherein a second size of the second bottom transistor is four times the fourth size, wherein a third size of the third bottom transistor is two times the fourth size, wherein the first top transistor is the first size, the second top transistor is the second size, the third top transistor is the third size, and the fourth top transistor is the fourth size.

9. The hardware-implemented hybrid analog-digital mixed-mode matrix multiply-add PE for ML applications of claim 8, wherein a first branch of transistors comprises the first bottom transistor and the first top transistor, wherein a second branch of transistors comprises the second bottom transistor and the second top transistor, wherein a third branch of transistors comprises the third bottom transistor and the third top transistor, wherein a fourth branch of transistors comprises the fourth bottom transistor and the fourth top transistor.

10. The hardware-implemented hybrid analog-digital mixed-mode matrix multiply-add PE for ML applications of claim 9, wherein current in the fourth branch is equal to the reference current, current in the third branch is two times the reference current, current in the second branch is four times the reference current, and current in the first branch is eight times the reference current.

11. The hardware-implemented hybrid analog-digital mixed-mode matrix multiply-add PE for ML applications of claim 10, wherein a connection of drains of the first top transistor, the second top transistor, the third top transistor, and the fourth top transistor provides a summation of the currents of the first branch, the second branch, the third branch, and the fourth branch, wherein the summation provides a binary representation of the incoming data in terms of current.

12. The hardware-implemented hybrid analog-digital mixed-mode matrix multiply-add PE for ML applications of claim 11, wherein the plurality of second circuit transistors comprise a lower PMOS, an upper PMOS, a lower stack of second circuit transistors, and an upper stack of second circuit transistors, wherein the summation of the currents serves as a second circuit reference current for a current mirror formed by the lower PMOS and the lower stack of second circuit transistors, wherein the upper stack of second circuit transistors serve as a DAC for incoming weight vector data.

13. The hardware-implemented hybrid analog-digital mixed-mode matrix multiply-add PE for ML applications of claim 12, wherein the lower stack of second circuit transistors comprises a first lower transistor, a second lower transistor, a third lower transistor, and a fourth lower transistor, wherein the upper stack of second circuit transistors comprise a first upper transistor, a second upper transistor, a third upper transistor, and a fourth upper transistor.

14. The hardware-implemented hybrid analog-digital mixed-mode matrix multiply-add PE for ML applications of claim 13, wherein a first branch of second circuit transistors comprises the first lower transistor and the first upper transistor, wherein a second branch of second circuit transistors comprises the second lower transistor and the second upper transistor, wherein a third branch of second circuit transistors comprises the third lower transistor and the third upper transistor, wherein a fourth branch of second circuit transistors comprises the fourth lower transistor and the fourth upper transistor.

15. The hardware-implemented hybrid analog-digital mixed-mode matrix multiply-add PE for ML applications of claim 14, wherein current in the fourth branch of second circuit transistors is equal to the second circuit reference current, current in the third branch of second circuit transistors is two times the second circuit reference current, current in the second branch of second circuit transistors is four times the second circuit reference current, and current in the first branch of second circuit transistors is eight times the second circuit reference current.

* * * * *